(12) United States Patent
Wang et al.

(10) Patent No.: US 10,440,247 B2
(45) Date of Patent: *Oct. 8, 2019

(54) CAMERA MODULE AND MANUFACTURING METHOD THEREOF

(71) Applicant: NINGBO SUNNY OPOTECH CO., LTD., Ningbo, Zhejiang (CN)

(72) Inventors: Mingzhu Wang, Ningbo (CN); Bojie Zhao, Ningbo (CN); Takehiko Tanaka, Ningbo (CN); Zhen Huang, Ningbo (CN); Nan Guo, Ningbo (CN)

(73) Assignee: Ningbo Sunny Opotech Co., Ltd., Ningbo, Zhejiang (CN)

( * ) Notice: Subject to any disclaimer, the term of this patent is extended or adjusted under 35 U.S.C. 154(b) by 59 days.

This patent is subject to a terminal disclaimer.

(21) Appl. No.: 15/635,152

(22) Filed: Jun. 27, 2017

(65) Prior Publication Data
US 2018/0048798 A1    Feb. 15, 2018

Related U.S. Application Data

(63) Continuation of application No. 15/093,704, filed on Apr. 7, 2016, now Pat. No. 9,781,323.

(51) Int. Cl.
*H04N 5/225* (2006.01)
*H01L 27/146* (2006.01)
*H05K 3/28* (2006.01)

(52) U.S. Cl.
CPC ..... *H04N 5/2257* (2013.01); *H01L 27/14618* (2013.01); *H04N 5/2253* (2013.01); *H04N 5/2254* (2013.01); *H05K 3/284* (2013.01); *H01L 2224/48091* (2013.01); *H05K 2201/10151* (2013.01); *H05K 2203/1316* (2013.01)

(58) Field of Classification Search
CPC .. H04N 5/2253; H04N 5/2254; H04N 5/2257; H05K 2203/1316; H05K 3/284; H01L 2924/00; H01L 2224/73265; H01L 2224/4554; H01L 27/14618; H01L 2924/181; G02B 7/025; G02B 27/0006
See application file for complete search history.

(56) References Cited

U.S. PATENT DOCUMENTS

| | | | |
|---|---|---|---|
| 6,924,540 B2* | 8/2005 | Shirakawa | G11B 7/13 257/434 |
| 2007/0210246 A1* | 9/2007 | Ellenberger | H01L 27/14618 250/239 |
| 2007/0287216 A1* | 12/2007 | Derderian | H01L 27/14618 438/67 |
| 2008/0099864 A1* | 5/2008 | Wu | H01L 27/14618 257/432 |

(Continued)

*Primary Examiner* — Chia Wei A Chen
(74) *Attorney, Agent, or Firm* — Raymond Y. Chan; David and Raymond Patent Firm

(57) ABSTRACT

A camera module includes a circuit board, an optical lens, an insulating member, a photosensitive sensor, and an integral encapsulating support structure. The insulating member is disposed on the periphery of a photosensitive area of the photosensitive sensor to prevent the photosensitive sensor from contacting to and being damaged by the formation mold during the forming process of the integral encapsulating support structure and to prevent the fluid material from flowing to the photosensitive area of the photosensitive sensor.

23 Claims, 7 Drawing Sheets

(56) References Cited

U.S. PATENT DOCUMENTS

| | | | |
|---|---|---|---|
| 2008/0265134 A1* | 10/2008 | Kinoshita | G03B 17/00 250/206 |
| 2008/0284897 A1* | 11/2008 | Lv | G02B 7/021 348/340 |
| 2008/0291316 A1* | 11/2008 | Cheng | H01L 25/16 348/340 |
| 2008/0309814 A1* | 12/2008 | Kinoshita | G02B 13/001 348/340 |
| 2008/0316623 A1* | 12/2008 | Aoki | G02B 7/04 359/823 |
| 2009/0109330 A1* | 4/2009 | Nakano | G02B 7/08 348/374 |
| 2009/0153707 A1* | 6/2009 | Nakao | G02B 7/021 348/294 |
| 2009/0160998 A1* | 6/2009 | Fukamachi | G02B 7/021 348/340 |
| 2009/0256222 A1* | 10/2009 | Hsu | H01L 27/14618 257/432 |
| 2010/0035373 A1* | 2/2010 | Hunziker | G01D 3/028 438/48 |
| 2010/0110270 A1* | 5/2010 | Sekimoto | H04N 5/2254 348/340 |
| 2010/0157142 A1* | 6/2010 | Ryu | G02B 7/021 348/373 |
| 2011/0024861 A1* | 2/2011 | Tu | H01L 27/14618 257/434 |
| 2011/0156187 A1* | 6/2011 | Tu | H01L 27/14618 257/432 |
| 2011/0156188 A1* | 6/2011 | Tu | H01L 27/14618 257/432 |
| 2013/0235259 A1* | 9/2013 | Dharmatilleke | H04N 13/204 348/373 |
| 2014/0055668 A1* | 2/2014 | Wang | H04N 5/2257 348/374 |
| 2015/0138436 A1* | 5/2015 | Wong | H04N 5/2257 348/374 |
| 2015/0334277 A1* | 11/2015 | Liu | H04N 5/2252 348/374 |

* cited by examiner

CAMERA MODULE AND MANUFACTURING METHOD THEREOF

CROSS REFERENCE OF RELATED APPLICATION

This is a Continuation application that claims the benefit of priority under 35 U.S.C. § 120 to a non-provisional application, application Ser. No. 15/093,704, filed Apr. 7, 2016. The afore-mentioned patent application is hereby incorporated by reference in its entirety.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to the field of camera, and more particularly, to a camera module and manufacturing method thereof.

Description of Related Arts

Conventional camera module is made by independently producing each of the components and then assembling them by packaging. Specifically, a conventional camera module includes a circuit board, a photosensitive sensor, a frame, a set of resistance-capacitance components, and an optical lens. After the circuit board, the photosensitive sensor, the frame, the resistance-capacitance components, and the optical lens are respectively produced, the photosensitive sensor, the resistance-capacitance components, and the frame are respectively and spacedly adhered on the same side of the circuit board, wherein the photosensitive sensor is electrically connected to the circuit board by electrically conducting peripheral edges of the photosensitive sensor to the circuit board through one or more wires, made of conductive material such as gold or aluminum alloy, by means of a wire bonding technique. The optical lens is arranged to be positioned along a photosensitive path of the photosensitive sensor. In the horizontal direction of the camera module of the current art, safety distances are required to be reserved between both the resistance-capacitance component and the gold wire and the resistance-capacitance components and the frame. In the vertical direction of the camera module of the current art, a safety distance is also required to be reserved between the resistance-capacitance components and the frame. This conventional way of the camera module in current art results a larger size of the camera module in the height size, length size and width size, that makes the size of the camera module being difficult to satisfy the development trend of having lighter and thinner electronic devices in the recent years.

In order to solve this problem, camera module made based on the MOC (Molding On Chip) packaging technique is developed by the applicant, wherein the frame, the photosensitive sensor and the resistance-capacitance components are respectively adhered on the circuit board to form an integral structure. Since no safety distance is required to be reserved between the frame and the resistance-capacitance component, the sizes in height, width and length of the camera module can be reduced. Besides, the integrally connection of the photosensitive sensor, the resistance-capacitance component, the circuit board, and the frame of the camera module can reinforce the strength of the circuit board and thus also enhance the strength of the camera module. In particular, after the photosensitive sensor and the resistance-capacitance component are respectively attached on the circuit board, the circuit board is placed within a mold. Then, the upper part of the mold directly applies pressure on the peripheral edges of the photosensitive sensor so as to isolate the photosensitive area from the non-photosensitive area of the photosensitive sensor. By melting molding material to fill the mold, the molding material after solidification will enclose and wrap up all the resistance-capacitance components, boding wires between the photosensitive sensor and the circuit board and the non-photosensitive area of the photosensitive sensor, so as to combine the photosensitive sensor, the resistance-capacitance component, the circuit board, and the frame to an integral structure. Such manufacturing process and structure of the camera module however have the following problems.

First, normally in order to enhance the photosensitivity of the photosensitive sensor, each pixel element of the photosensitive sensor has a micron level microlens. For example, a 13-million-pixel photosensitive sensor has 13 million microlenses respectively matching each of the pixel element. The matching relationships between the microlens and the pixel elements include size, position, and suitable structure. Because the microlenses are micron level lenses, they are extremely vulnerable, especially under the high temperature and high pressure circumstance in the mold. Damages of the microlens are the mainly breakdowns, distortions, or dislocations of the microlens. Once any one of the microlenses of the photosensitive sensor is damaged, the imaging quality of the camera module would certainly be affected.

Next, since the circuit board and while the photosensitive sensor is attached on the circuit board would have certain tolerances, a tilt would occur after the photosensitive sensor was attached on the circuit board. As the mold presses on the peripheral edges of the photosensitive sensor, gaps will be formed between the mold and the peripheral edges of the photosensitive sensor. Therefore, when the molding material is filled into the mold to form the frame that integrally combines the circuit board, the photosensitive sensor, and the resistance-capacitance components with the molding material, the molding material will leak out through the gap formed between the mold and the photosensitive sensor. The leaked molding material forms burrs at the edges of the frame that shelter the photosensitive path of the photosensitive sensor, that affects the imaging quality of the camera module. In addition, the molding material leaked from the gaps formed between the mold and the photosensitive sensor is in fluid form that has a higher temperature, so that once the molding material flows to the photosensitive area of the photosensitive area, the molding material with high temperature would cause damages to the photosensitive area of the photosensitive sensor and the microlenses of the photosensitive area of the photosensitive sensor.

SUMMARY OF THE PRESENT INVENTION

An object of the present invention is to provide a camera module and manufacturing method thereof, wherein the camera module includes at least one photosensitive sensor, at least one insulating member, a circuit board, and an integral package supporter, wherein the insulating member is provided at a periphery around at least a photosensitive area of the photosensitive sensor, and the integral encapsulating support structure is formed to enclose, case and/or wrap up a non-photosensitive area of the photosensitive sensor, the circuit board and the bonding wires therebetween, wherein the insulating member is provided to prevent the forming material of the integral encapsulating support structure, before it is solidified, from flowing to the photosensitive area of the photosensitive sensor during the formation process of the integral encapsulating support structure.

An object of the present invention is to provide a camera module and manufacturing method thereof, wherein the insulating member is protruded on the photosensitive sensor to enable a bottom surface of an upper mold of the formation mold to contact with the insulating member. In other words, the insulating member can provide a cushioning effect and avoid the bottom surface of the upper mold of the formation mold from directly contacting with the photosensitive sensor, so as to protect the photosensitive area of the photosensitive sensor from being damaged by the applied pressure of the upper mold of the formation mold.

An object of the present invention is to provide a camera module and manufacturing method thereof, wherein the insulating member can prevent the forming material of the integral encapsulating support structure before it is solidified from flowing from the non-photosensitive area to the photosensitive area of the photosensitive sensor. In addition, when the integral encapsulating support structure is formed and solidified, the insulating member is able to prevent any burr from forming at the side, toward the photosensitive sensor, of the integral encapsulating support structure, so as to increase the product yield rate of the camera module.

An object of the present invention is to provide a camera module and manufacturing method thereof, wherein the insulating member may have elasticity and flexibility that allows the insulating member to deform according to the gap formed between the upper mold of the formation mold and the photosensitive sensor. Therefore, the photosensitive area of the photosensitive sensor is insulated from external environment by the insulating member, so that the forming material of the integral encapsulating support structure is prevented from entering the photosensitive area of the photosensitive sensor through the gap formed between the upper mold of the formation mold and the photosensitive sensor, so as to ensure the reliability of the camera module during the manufacturing process of the camera module.

An object of the present invention is to provide a camera module and manufacturing method thereof, wherein the insulating member is provided to have stickiness for sticking pollutant such as dusts, so as to enhance the imaging quality of the camera module by reducing the dirty spot of the photosensitive area of the photosensitive sensor.

An object of the present invention is to provide a camera module and manufacturing method thereof, wherein the camera module includes at least one filter element which can be provided on the filter element, wherein the integral encapsulating support structure which encloses, cases and/or wraps up the circuit board and an outer area of the filter element after it is formed and solidified, so that the integral encapsulating support structure, the filter element, the photosensitive sensor, and the circuit board are connected with each other to form an integral body. In addition, the insulating member substantially prevents the forming material from entering the inner effective function area of the filter element and prevents the filter element from being damaged during the mold pressing process.

An object of the present invention is to provide a camera module and manufacturing method thereof, wherein the surface of the upper mold of the formation mold is provided with a covering film which can provide additional protection to the photosensitive sensor when the mould of the formation mold is applying pressure thereto, wherein the covering film also facilitates mold unloading and increases sealing ability while avoiding burr formation.

An object of the present invention is to provide a camera module and manufacturing method thereof, wherein the formation mold can be provided with an indented portion corresponding to the photosensitive area of the photosensitive sensor so as to further avoid adverse effect to the photosensitive sensor.

According to the present invention, in order to achieve the above objectives and advantages and other advantages, a camera module is provided, which comprises:

at least a circuit board;
    at least one optical lens;
    at least one insulating member;
    at least one photosensitive sensor having a photosensitive area and a non-photosensitive area provided thereon;
    at least one insulating member provided around the periphery around at least the photosensitive area of the photosensitive sensor for insulating the photosensitive area from the non-photosensitive area; and
    at least one integral encapsulating support structure, integrally enclosing, casing and/or covering the circuit board and at least a portion of the non-photosensitive area of the photosensitive sensor, wherein the integral encapsulating support structure, the photosensitive sensor and the circuit board are combined to form an integral structure, wherein the optical lens is installed along a photosensitive path of the photosensitive sensor, and the photosensitive sensor is electrically connected with the circuit board.

In one embodiment, the camera module further comprises a camera lens supporter, wherein the camera lens supporter is provided on the integral encapsulating support structure and the optical lens is supported on the camera lens supporter.

In one embodiment, the integral encapsulating support structure integrally extends to form the camera lens supporter.

In one embodiment, the camera module further comprises at least a driver such as a motor, wherein the driver is installed on the integral encapsulating support structure and is electrically connected with the circuit board, wherein the optical lens is installed on the driver.

In one embodiment, the camera module further comprises at least one filter element, wherein the filter element is disposed on top of the integral encapsulating support structure.

In one embodiment, the camera module further comprises a set of electrical components such as resistance-capacitance components, wherein the resistance-capacitance components are attached on the circuit board, wherein the integral encapsulating support structure encloses, cases, and/or wraps up the resistance-capacitance components and the bonding wires therein.

In one embodiment, the insulating member is formed by solidified elastic material such as solidified adhesive, rubber, silicon, polyester material.

In one embodiment, the material that formed the insulating member is preferably to further have a stickiness after solidification, so as to stick dust within the camera module.

Certainly, in other embodiments, the material can also have no stickiness after solidification. The present invention shall not be limited herein.

In one embodiment, the insulating member formed by solidified material has an elasticity.

In one embodiment, the integral encapsulating support structure covers the peripheral surface of the insulating member.

According to another aspect of the present invention, the present invention provides a camera module, which includes:

at least one circuit board;
at least one optical lens;
at least one insulating member;
at least one photosensitive sensor;
at least one filter element, wherein the filter element is provided above the photosensitive sensor, wherein the insulating member is disposed on the periphery edge of the filter element; and
an integral encapsulating support structure, wherein the integral encapsulating support structure encloses, cases and/or wraps up the circuit board and the outer area of the filter element, so that when the integral encapsulating support structure is formed, the integral encapsulating support structure, the filter element, the photosensitive sensor, and the circuit board integrally combine together to form an integral structure, wherein the optical lens is supported along a photosensitive path of the photosensitive sensor, wherein the photosensitive sensor is electrically connected with the circuit board.

According to another aspect of the present invention, the present invention also provides a manufacturing method of camera module, wherein the manufacturing method includes the following steps:

(a) electrically connecting at least one photosensitive sensor with at least one circuit board;

(b) placing the circuit board and the photosensitive sensor in a formation mold;

(c) providing an insulating member between the photosensitive sensor and a bottom surface of an upper mold of the formation mold, wherein the insulating member is positioned around the periphery around at least the photosensitive area of the photosensitive sensor;

(d) enclosing, casing and/or wrapping up the circuit board and a non-photosensitive area of the photosensitive sensor and the circuit board by a molding material added in the formation mold, so as to form an integral encapsulating support structure after the molding material is solidified that integrally combines the photosensitive sensor and the circuit board to form an integral structure; and (e) providing at least one optical lens, wherein the optical lens is supported along a photosensitive path of the photosensitive sensor, whereby the camera module is manufactured.

In one embodiment, an inner groove is formed in the upper mold of the formation mold at an area corresponding to the photosensitive sensor.

In one embodiment, a covering film is provided on a bottom surface of the upper mold of the formation mold.

In one embodiment, in the step (d), the molding material encloses, cases and covers the circuit board.

In one embodiment, the integral encapsulating support structure is formed to enclose and cover the non-photosensitive area of the photosensitive sensor positioned outside the insulating member and an outer peripheral surface of the insulating member.

In one embodiment, in the above steps, an insulating material is applied along the periphery edge of the photosensitive sensor to form the insulating member on the periphery edge of the photosensitive sensor after the insulating member is solidified.

In one embodiment, glue or spray adhesive is used as the insulating member in the above application step (c).

In one embodiment, the integral encapsulating support structure is made by injection molding, compression molding or pressing mold technology.

In one embodiment, the adhesive to be used as the insulating member is solidified by damp, heat, UV (Ultraviolet) lighting, or other solidifying reaction.

In one embodiment, the camera module can be fixed focus camera module or zoom camera module.

According to another aspect of the present invention, the present invention also provides a manufacturing method of camera module, wherein the manufacturing method includes the following steps:

(A) electrically connecting at least one photosensitive sensor with at least one circuit board;

(B) overlapping a filter element with the photosensitive sensor;

(C) placing the circuit board, the photosensitive sensor, and the filter element in a formation mold;

(D) providing an insulating member between the optical filter and a bottom surface of an upper mold of the formation mold, wherein the insulating member is positioned at an outer peripheral edge of the optical filter;

(E) enclosing, casing and/or wrapping up the circuit board and the peripheral edge of the filter element by molding material added in the formation mold to form an integral encapsulating support structure that integrally combines with the filter element, the photosensitive sensor and the circuit board after the molding material is solidified.

(F) providing at least one optical lens, wherein the optical lens is supported along a photosensitive path of the photosensitive sensor, whereby the camera module is manufactured.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

The following is disclosed in order that those skilled in the art can implement the present invention. Preferred embodiments in the following descriptions are to give examples only. Those skilled in the art can think of other obvious modifications. The basic notions of the present invention defined in the following descriptions can apply to other implementations, modifications, improvements, equivalences, and other technical solutions that do not deviate the scope or spirit of the present invention.

Figure 1:
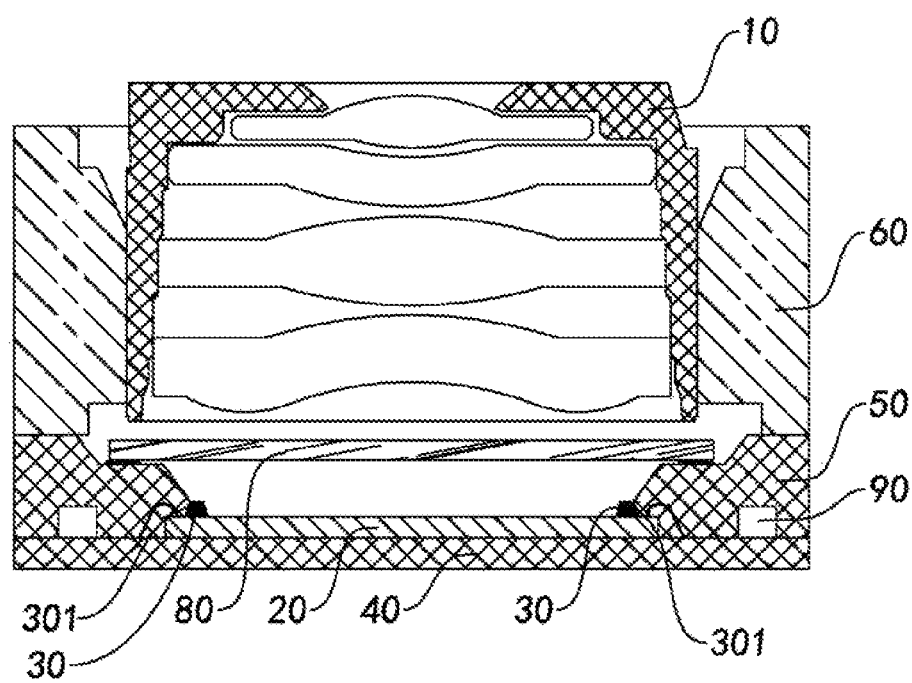
FIG. 1 is a sectional view of a camera module according to a preferred embodiment of the present invention illustrating an internal structure thereof.
Figure 2:
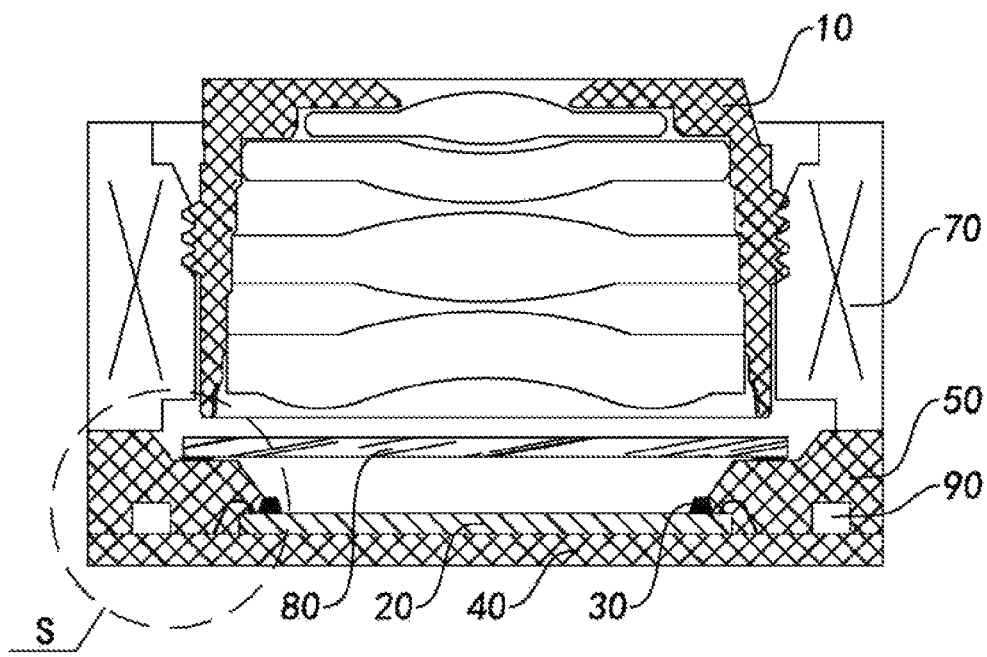
FIG. 2 is a sectional view of a camera module according to another preferred embodiment of the present invention illustrating an internal structure thereof.

Referring to FIGS. 1 and 2, the present invention provides a camera module and a manufacturing method thereof, wherein the camera module can be installed in an electronic device for capturing information, including image or video, of the environment around the electronic device.

It is worth mentioning that type of such electronic device is not limited. For example, the electronic device can be a civil electronic device, such as a smartphone, a tablet, a media player, a laptop, a PDA, or a remote controller, a medical electronic device, such as an endoscope, or any other electronic device that can equip the array camera module in other fields.

When the structure and manufacturing method of the camera module are disclosed and described in this application, the term "a" shall be noted as "at least one" or "one or more" which means in an embodiment, the quantity of an element can be one, while in another embodiment, the quantity of the element can be multiple. Therefore, the term "a" cannot be considered as a limitation of quantity.

Similarly, when the structure and manufacturing method of the camera module are disclosed and described in this application, any directional terminologies like "longitudinal," "lateral," "upper," "front," "back," "left," "right," "perpendicular," "horizontal," "top," "bottom," "inner," "outer," and etc. that indicate relations of direction or position are based on the relations of direction or position shown in the appended drawings, which is only for ease of describing the present invention and simplifying the description, rather than to indicate or imply that the referred device or element has to apply specific direction or to be operated or structured in specific direction. Therefore, the above mentioned terminologies shall not be interpreted as limitation to the present invention.

The camera module of the present invention as shown in FIG. 1 can be embodied as a fixed focus module, wherein the camera module includes at least one optical lens 10, at least one photosensitive sensor 20 such as a photosensitive chip, at least one insulating member 30, a circuit board 40, and an integral encapsulating support structure 50. The photosensitive sensor 20 is conductively and electrically connected with the circuit board 40. The insulating member 30 is provided to insulate a photosensitive area of the photosensitive sensor 20 with the encapsulating support structure that, in one embodiment, the insulating member 30 is provided around the periphery around at least the photosensitive area of the photosensitive sensor 20. It is embodied that the insulating member 30 has a ring-shape and is positioned in a non-photosensitive area of the photosensitive sensor 20. The integral encapsulating support structure 50 is molded on the circuit board 40 to enclose, case, and/or wrap up every non-photosensitive area of the photosensitive sensor 20 and an outer peripheral surface 301 of the insulating member 30. The optical lens 10 is supported along a photosensitive path of the photosensitive sensor 20. Light reflected from an object enters the camera module through the optical lens 10, and then is captured by the photosensitive sensor 20 to conduct a photoelectric conversion to generate corresponding image of the object.

The insulating member 30 is adapted for insulating the encapsulating support structure 50 from blocking the photosensitive area of the photosensitive sensor 20. For example, the insulating member 30 can be embodied as ring-shaped, such as a circular or square frame shape. In other words, the middle of the insulating member 30 is hollow, so as to avoid the insulating member 30 from blocking the photosensitive area of the photosensitive sensor 20.

It is worth mentioning that although FIG. 1 illustrates that the camera module of the present invention only includes one optical lens 10 and one photosensitive sensor 20. Those skilled in the art should be able to understand that the camera module of the present invention can also include two or more optical lenses 10 and two or more photosensitive sensors 20, so as to have the camera module forming an array camera module. Therefore, the camera module of the present invention as shown in FIG. 1 is merely an exemplary description. In fact, the quantities and types of the optical lens 10 and the photosensitive sensor 20 of the present invention should not limit the detail and scope of the camera module of the present invention.

Besides, the photosensitive sensor 20 of the camera module of the present invention as shown in FIG. 1 is mounted on the circuit board 40 and conductively and electrically connected to the circuit board 40 through the technology of gold, silver or copper wire bonding. Nevertheless, person skilled in art should understand that the circuit board 40 may have a circuit board bonding pad and the photosensitive sensor can have a chip bonding pad, so that the photosensitive sensor 20 can be mounted on the circuit board 40 with the chip bonding pad of the photosensitive sensor 20 corresponding to the circuit board bonding pad of the circuit board 40, while the photosensitive sensor 20 and the circuit board 40 is conductively and electrically connected with each other. In addition, the photosensitive sensor 20 can also merely electrically connected to the circuit board 40 without mounting thereon. As a result, the flatness and smoothness of the photosensitive sensor 20 will not be affected and limited by the flatness and smoothness of the circuit board 40. For example, the flatness and smoothness of the photosensitive sensor 20 can be ensured by means of the integral encapsulating support structure 50.

Furthermore, the camera module includes at least a camera lens supporter 60, wherein the camera lens supporter 60 is disposed on top of the respective integral encapsulating support structure 50. The optical lens 10 is supported in the respective camera lens supporter 60 that substantially holds the optical lens 10 in position and be aligned along the photosensitive path of the photosensitive sensor 20. It is worth mentioning that in one embodiment of the camera module of the present invention, the camera lens supporter 60 is able to be separately made and then mounted on the integral encapsulating support structure 50. In one embodiment of the camera module of the present invention, the integral encapsulating support structure 50 can be made integrally extending to form the camera lens supporter 60. In other words, the camera lens supporter 60 and the integral encapsulating support structure 50 can be integrally formed, wherein the deviation generated when mounting an independent camera lens supporter 60 on the integral encapsulating support structure 50 is eliminated and thus the imaging quality of the camera module is improved by reducing the package tilt of the camera module.

Figure 3:
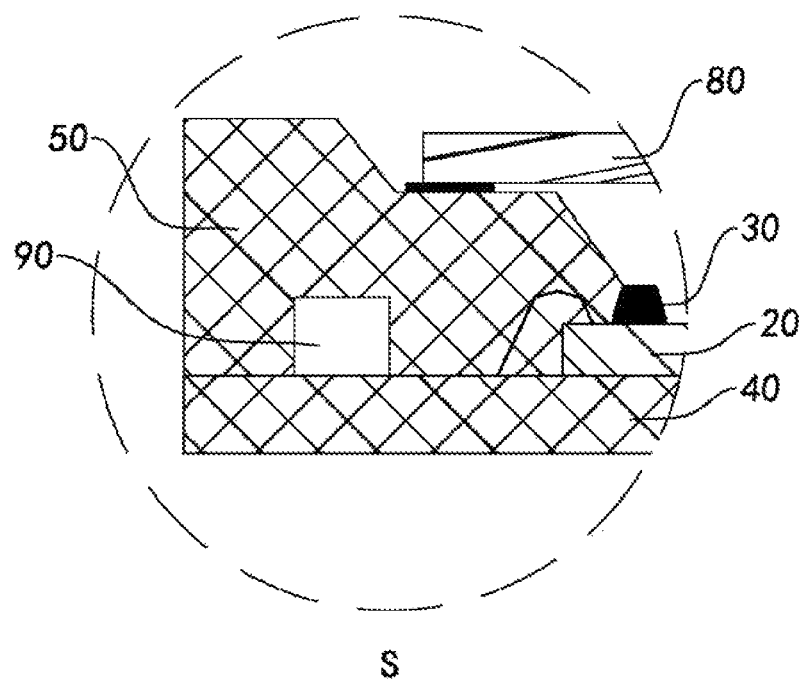
FIG. 3 is a partially enlarged view of the S portion of FIG. 2.

FIGS. 2 and 3 illustrate an example of the camera module of the present invention that is embodied as a zoom lens module, which is able to change the focal length of the camera module based on specific utility needs of the user, so as to enhance the environmental adaptability of the camera module. Specifically, the camera module of the present invention includes at least a driver, which can be any similar driver unit. For example, it can be a voice coil motor 70 according to the present embodiment. Each voice coil motor 70 is mounted on the respective integral encapsulating support structure 50 and electrically connected with the circuit board 40. The optical lens 10 is drivably mounted on the voice coil motor 70 and kept aligned along the photosensitive path of the photosensitive sensor 20 by the voice coil motor 70. Besides, the voice coil motor 70 is able to drive the optical lens 10 to move back and forth along the photosensitive path of the photosensitive sensor 20 for adjusting the focal length of the camera module.

Person skilled in the art should understand that the voice coil motor 70 of the camera module of the present invention can be electrically connected to the circuit board 40 through various ways. For example, in one embodiment, the integral encapsulating support structure 50 is able to be built in with at least a wire having one end electrically connected to the circuit board 40 and the other end forming a bonding pad on the surface of the integral encapsulating support structure 50 or the other end connected to a bonding pad provided on the surface of the integral encapsulating support structure 50. Therefore, as the voice coil motor 70 is mounted on the integral encapsulating support structure 50, the bonding pad of the voice coil motor 70 and the bonding pad of the surface of the integral encapsulating support structure 50 are bonded together so as to electrically connect the voice coil motor 70 with the circuit board 40. For example, in another embodiment, the voice coil motor 70 can be conductively connected to the circuit board 40 by coating a conductive layer on the surface of the integral encapsulating support structure 50.

Further, the camera module of the present invention includes at least one filter element 80. The filter element 80 is supported between the optical lens 10 and the photosensitive sensor 20. Light reflected from an object enters the camera module through the optical lens 10. Then the light is filtered by the filter element 80 and received by the photosensitive sensor 20 to conduct a photoelectric conversion. The filter element 80 is able to reduce noise effect and improve the imaging quality of the camera module.

It is worth mentioning that types of the filter element 80 is not limited. For example, in a preferred embodiment of the camera module of the present invention, the filter element 80 can be embodied as an IR-Cut Filter. As a result, the filter element 80 can be used to filter infrared ray in the light. Also, in another preferred embodiment of the camera module of the present invention, the filter element 80 can be embodied as a piece of fully-transparent spectrum filter.

The integral encapsulating support structure 50 forms at least one platform for mounting the filter element 80 in position. For example, the platform may have a mounting slot formed on the top of the integral encapsulating support structure 50 or form no mounting slot on the top and the filter element 80 is mounted thereon directly. When the camera module of the present invention is embodied as the array camera module, the quantity of the filter element 80 can be embodied as one piece, and all the optical lenses 10 and the photosensitive sensors 20 are respectively provided corresponding to different portions of the filter element 80. Nevertheless, quantity of the filter element 80 of the present invention is preferably equal to the quantity of the photosensitive sensor 20 and the optical lens 10, so that each filter element 80, each optical lens 10, and each photosensitive sensor 20 are arranged to one another correspondingly.

Figure 4:
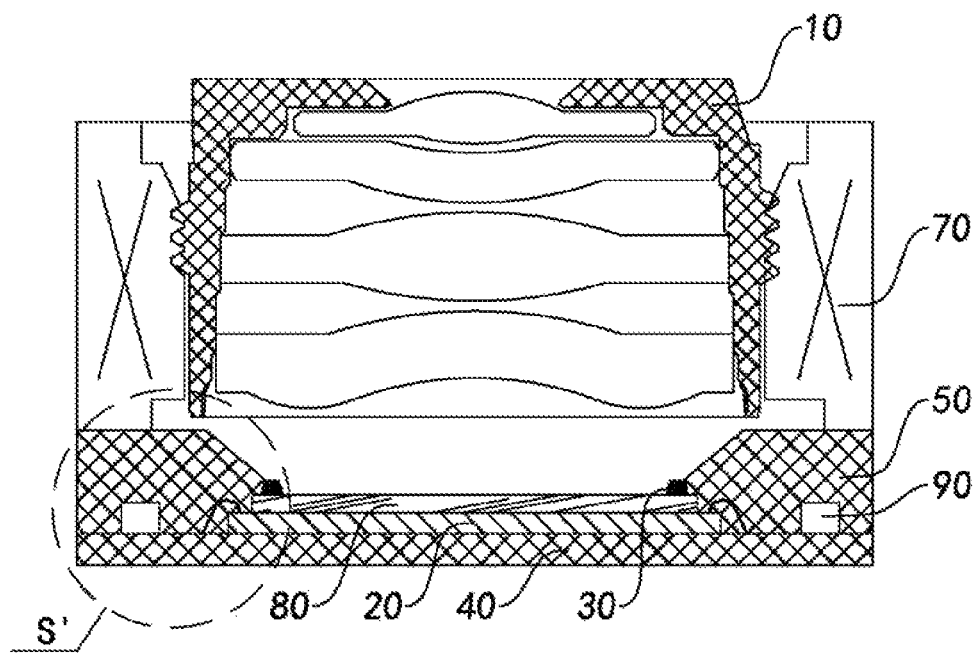
FIG. 4 is a sectional view of a camera module according to another preferred embodiment of the present invention illustrating the internal structure thereof.
Figure 5:
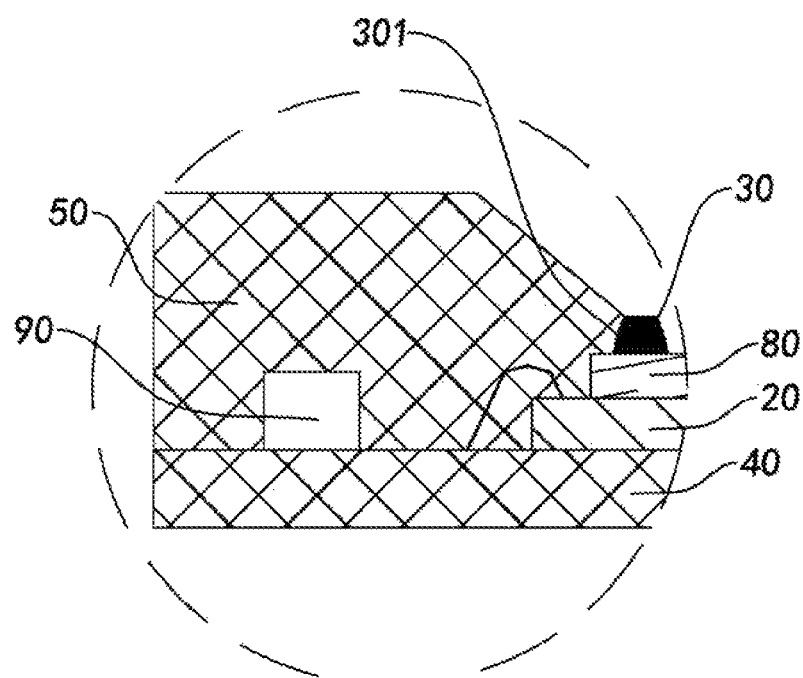
FIG. 5 is a partially enlarged view of the S' portion of FIG. 3.

FIGS. 4 and 5 illustrate another preferred embodiment of the camera module of the present invention, wherein the insulating member 30 is not disposed on the photosensitive sensor 20. Particularly, in the embodiment as shown in FIGS. 4 and 5, the filter element 80 is embodied to disposed overlappingly on top of the photosensitive sensor 20 which is electrically connected to the circuit board 40. The insulating member 30 is disposed on the peripheral edge of the filter element 80 to divide an inner area and an outer area of the filter element 80 by the insulating member 30. The integral encapsulating support structure 50 is formed to enclose and cover the circuit board 40 and the outer area of the filter element 80 and the circuit board 40, so as to integrally couple the integral encapsulating support structure 50, the filter element 80, the photosensitive sensor 20, and the circuit board 40 to form an integral structure.

By overlapping the filter element 80 on the photosensitive sensor 20 and then forming the integral encapsulating support structure 50 as described above, the photosensitive area of the photosensitive sensor 20 can be prevented from being damaged or polluted by the molding material during the molding of the integral encapsulating support structure 50, so as to ensure the reliability of the photosensitive sensor 20.

It is worth mentioning that the portion of the filter element 80 corresponding to the photosensitive area of the photosensitive sensor 20 is defined as the inner area of the filter element 80. The portion of the filter element 80 corresponding to the non-photosensitive area of the photosensitive sensor 20 is defined as the outer area of the filter element 80. The insulating member 30, adapted for insulating the photosensitive area of the photosensitive sensor 20 from the integral capitulating support structure 50, is disposed between the inner area and the outer area on the filter element 80 according to the present embodiment. After the integral encapsulating support structure 50 is formed by such as compression molding, the integral encapsulating support structure 50 encloses, cases, and wraps up the outer area of the filter element 80 to ensure the integral encapsulating support structure 50 do not block the photosensitive area of the photosensitive sensor 20 as well as the corresponding inner area of the filter element 80. It is worth mentioning that the periphery of the photosensitive area of the photosensitive sensor 20 between the photosensitive sensor 20 and the filter element 80 can be applied with adhesive to further provide an insulating structures.

Besides, according to the present embodiment of the camera module of the present invention, the filter element 80 is directly overlapped with the photosensitive sensor 20 that can decrease a back focal length of the camera module. By so, it is more likely to reduce the height size of the camera module that renders the camera module of the present invention adapted to be more applicable to electronic devices to meet the lighter and thinner demands thereof.

Figure 6:
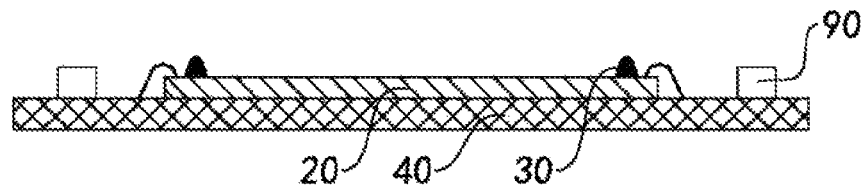
FIG. 6 is a schematic view illustrating the first step of a manufacturing process of the camera module according to the above preferred embodiment of the present invention.
Figure 7:
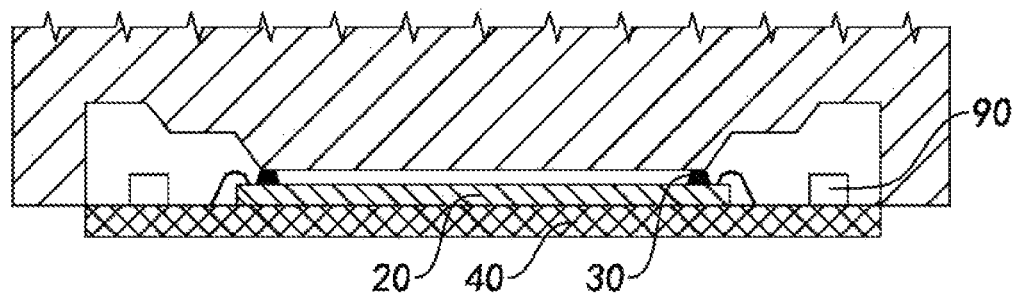
FIG. 7 is a schematic view illustrating the second step of a manufacturing process of the camera module according to the above preferred embodiment of the present invention.
Figure 8:
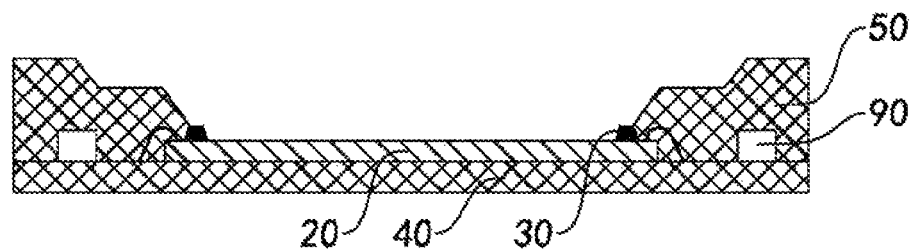
FIG. 8 is a schematic view illustrating the third step of a manufacturing process of the camera module according to the above preferred embodiment of the present invention.

Referring to FIGS. 6 to 8, a manufacture process of the camera module of the present invention is illustrated. FIG. 6 illustrates a step of the manufacturing process of the camera module as an embodiment, wherein the photosensitive sensor 20 is mounted on the circuit board 40. Besides, the photosensitive sensor 20 is electrically connected with the circuit board 40 with bonding wires by applying wire bonding technology. The insulating member 30 is attached on the periphery around the photosensitive area of the photosensitive sensor 20.

Optionally, in one embodiment of the camera module, the photosensitive sensor 20 and the circuit board 40 can be conductively connected with each other by means of bonding pad soldering. Hence, the example as shown in FIG. 6 that the photosensitive sensor 20 and the circuit board 40 are conductively connected with each other by gold bonding wires is merely a particular embodiment.

Besides, the photosensitive sensor 20 can be conductively connected with the circuit board 40 before attaching the insulating member 30 on the photosensitive sensor 20. On the other hand, the insulating member 30 can also be disposed on the photosensitive sensor 20 before electrically connecting the photosensitive sensor 20 with the circuit board 40.

In one embodiment of the present invention, after the photosensitive sensor 20 is electrically connected with the circuit board 40, an adhesive element in form of adhesive film, adhesive gel form or spraying glue is applied at least around the periphery of the photosensitive sensor 20, which forms the insulating member 30. It is worth mentioning that because the adhesive element is directly applied to attach on the photosensitive sensor 20 in adhesive gel form or spraying glue form, the insulating member 30 formed after solidification protrudes from the surface of the photosensitive sensor 20. Person skilled in the art should appreciate that the adhesive element can also be made from elastic material such as rubber, silicon, or polyester material and when the adhesive element having a predetermined stickiness is applied by drawing or spraying on the periphery around the photosensitive sensor 20, a certain height of the adhesive element is protruded to form the insulating member 30 while it is prevented from flowing to the photosensitive area of the photosensitive sensor 20 that ensures the photosensitive area of the photosensitive sensor 20 from being polluted by the adhesive element.

Furthermore, after the adhesive element is applied by drawing or spraying on the periphery of the photosensitive sensor 20, the adhesive element can be solidified on the photosensitive sensor 20 to form the insulating member 30 through solidifying reaction such as heat drying or UV (Ultraviolet) ray exposure. Nonetheless, person skilled in the art should understand that the adhesive element can also be solidified through other methods or be solidified naturally. Hence, the damp, heat treatment or UV exposure may accelerate the solidification process of the adhesive element, but it is not the only method and condition to solidify the adhesive element. It is worth mentioning that the adhesive element may or may not have stickiness after solidification. However, in some embodiments, when the adhesive element has stickiness, it can provide a resilient ability with respect to the compression die during molding and a sticking ability to attach dusts to reduce the dark spot defective of the camera module.

FIG. 7 illustrates another step of the manufacturing process of the camera module according to a preferred embodiment of the present invention, wherein the circuit board 40, the photosensitive sensor 20 and the insulating member 30 are received in a formation mold such as a compression mold and pressed against an upper mold of the formation mold. It is appreciated that the insulating member 30 protruded from the photosensitive sensor 20 ensures the upper mold of the formation mold to merely contact with the insulating member 30 and avoids any direct contact between the upper mold of the formation mold and the photosensitive sensor 20, especially the photosensitive area thereof, so as to prevent the photosensitive sensor 20 from being damaged under pressure from the upper mold of the formation mold.

It is worth mentioning that the insulating member 30 formed from the solidified adhesive element is preferred to have a elasticity or flexibility, so that the insulating member 30 may absorb any over pressure from the upper mold of the formation mold and compensate any tilt occurred in the attachment of the photosensitive sensor 20 and the circuit board 40. In other words, the insulating member 30 is deformable to insulate and isolate the photosensitive area of the photosensitive sensor 20 from the outside environment, that provides a relative sealing effect to prevent any liquid form molding material from flowing to the photosensitive area of the photosensitive sensor 20 during the molding process.

As show in FIG. 8, a step of forming the integral encapsulating support structure 50 in the manufacturing process of the camera module is illustrated, wherein the molding material, for example in solid form or in small particles or powder form, is placed in a formation mold, such as a compression mold, insert mold and die mold, and then heated to melt to liquid form material to flow to mold the encapsulating support structure 50. Then, after the integral encapsulating support structure 50 is solidified, the encapsulating support structure 50 encloses and wraps up at least the top surface of the circuit board 40 and the non-photosensitive area of the photosensitive sensor 20 to integrally connect the integral encapsulating support structure 50, the circuit board 40, and the photosensitive sensor 20 to form an integral structure.

It is appreciated that the integral encapsulating support structure 50 also covers the peripheral surface 301 of the insulating member 30 so that the integral encapsulating support structure 50, the circuit board 40, the insulating member 30, and the photosensitive sensor 20 are integrally connected together to form an integral structure.

It is worth mentioning that since the insulating member 30 isolates and insulates the photosensitive area of the photosensitive sensor 20 from the outside environment, the molding material heated to become liquid in the formation mold is not able to flow to the photosensitive area of the photosensitive sensor 20. That is the insulating member 30 stops the molding material for forming the integral encapsulating support structure 50 from flowing to the photosensitive area of the photosensitive sensor 20 from the non-photosensitive area thereof, that also prevents burrs be formed at the side, facing the photosensitive area of the photosensitive sensor 20, of the integral encapsulating support structure 50 so as to ensure the imaging quality of the camera module and increase the product yield rate of the camera module.

It is worth mentioning that the integral encapsulating support structure 50, the circuit board 40 and the photosensitive sensor 20 are integrally connected together to from an integral structure that substantially enforces the strength of the circuit board 40. In addition, the flatness and smoothness of the photosensitive sensor 20 will no longer be restricted to the flatness and smoothness of the circuit board 40, but to be maintained by the integral encapsulating support structure 50. Accordingly, the circuit board 40 can selectively be a flexible printed circuit board with less thickness. By so, it can further reduce the height size of the camera module so as to more applicable electronic device with the demands of being lighter and thinner. It is worth mentioning that the camera module of the present invention further includes a set of electrical elements including one or more resistance-capacitance components 90, wherein the resistance-capacitance components 90 are mounted on the circuit board 40. During the molding process, the heated liquid form molding material is compressed to flow and fill between the resistance-capacitance components 90 on the circuit board 40 automatically, so as to form the solidified integral encapsulating support structure 50 with all the resistance-capacitance components 90 being enclosed and covered therein. Therefore, the integral encapsulating support structure 50 can not only insulate the resistance-capacitance component 90 from the photosensitive sensor 20, but also overlap the integral encapsulating support structure 50 with the resistance-capacitance components 90 to save space that results in further reduction of the height size, length size and width size of the camera module.

The molding material is an insulation material such as resin or plastic. According to the preferred embodiment, resin material is preferred to be used as molding material to form the integral encapsulating support structure 50, which not only has good strength and electrical insulation ability, but also provides a good heat dissipation ability that has relatively high melting point after solidification and can conduct heat generated from the photosensitive sensor 20 in function to outside. Person skilled in the art should appreciate that these features and properties of the integral encapsulating support structure 50 of the present invention are especially effective in enhancing the performance of the camera module that is embodied as an array camera module having multiple camera modules built with a large piece of integral encapsulating support structure 50 encapsulated multiple circuit boards and photosensitive sensors for coupling with multiple optical lenses respectively as disclosed in the above embodiment.

It is worth mentioning that the insulating member 30 formed from the adhesive element may have stickiness after solidification so as to stick pollutant like dust that was generated during the manufacturing process of the camera module, and thus to stop pollutant like dust from polluting the photosensitive area of the photosensitive sensor, in order to enhance the imaging quality of the camera module by preventing dark spots of the camera module from occurring.

After the above manufacturing steps, the optical lens 10 is supported above the integral encapsulating support structure 50 and positioned along the photosensitive path of the photosensitive sensor 20 to produce the camera module. When the camera module is used, light reflected from an object enters the camera module through the optical lens 10, and then the light is filtered by the filter element 80 and received by the photosensitive sensor 20 to conduct a photoelectric conversion and generate image corresponding to the object.

In one embodiment of the camera module of the present invention, the optical lens 10 is held in the photosensitive path of the photosensitive sensor 20 by being installed on the integral encapsulating support structure 50 or on the camera lens supporter 60 integrally formed with the integral encapsulating support structure 50. In another embodiment of the camera module of the present invention, the optical lens 10 is held in the photosensitive path of the photosensitive sensor 20 by being installed on the voice coil motor 70 mounted on the integral encapsulating support structure 50.

Figure 9:
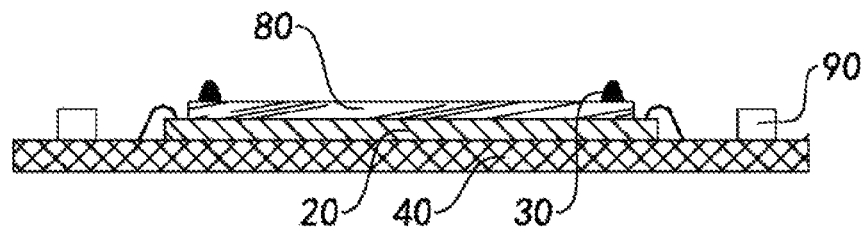
FIG. 9 is a schematic view illustrating the first step of another manufacturing process of the camera module according to the above preferred embodiment of the present invention.
Figure 10:
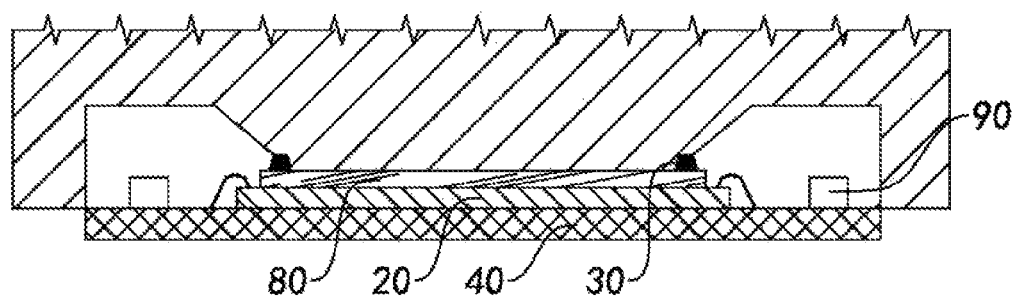
FIG. 10 is a schematic view illustrating the second step of another manufacturing process of the camera module according to the above preferred embodiment of the present invention.
Figure 11:
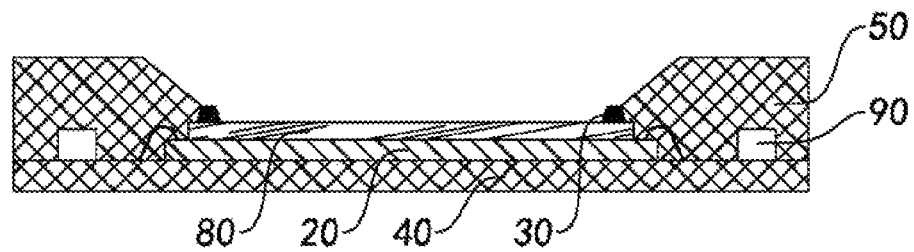
FIG. 11 is a schematic view illustrating the third step of another manufacturing process of the camera module according to the above preferred embodiment of the present invention.

Referring to FIGS. 9 to 11, an alternative manufacture process of the camera module of the present invention is illustrated. FIG. 9 illustrates an example of a specific step of the manufacturing process of the camera module, wherein the photosensitive sensor 20 is mounted and electrically connected to the circuit board 40, and the filter element 80 is overlappingly disposed above the photosensitive sensor 20, so as to position the inner area of the filter element 80 in correspondence with the photosensitive area of the photosensitive sensor 20 and to position the outer area of the filter element 80 in correspondence with the non-photosensitive area of the photosensitive sensor 20. The insulating member 30 is formed after an adhesive element applied on the filter element 80 by drawing or spraying is solidified.

FIG. 10 illustrates another step of the manufacturing process of the camera module according to one embodiment, wherein the circuit board 40, the photosensitive sensor 20, the filter element 80, and the insulating member 30 are received in the formation mold and being compressed against the upper mold of the formation mold. It is appreciated that due to the protruded insulating member 30 formed on the filter element 80, the upper mold of the formation mold can only contact with the insulating member 30 that avoids any direct contact between the upper mold of the formation mold and the filter element 80, so as to ensure the filter element 80 from being damaged by pressure from the upper mold of the formation mold.

It is worth mentioning that the insulating member 30 formed from the adhesive element is preferred to have elasticity and flexibility after solidification, so that when tilt exist in the attachment of the photosensitive sensor 20 and the circuit board 40, the insulating member 30 is able to compensate. In other words, the insulating member 30 insulates and isolates the inner area of the filter element 80 from other components of the camera module, so as to prevent the liquid form molding material from entering the inner area of the filter element 80 during the molding process of the integral encapsulating support structure 50.

FIG. 11 illustrates a step of the formation of the integral encapsulating support structure 50 in the manufacturing process of the camera module, wherein the molding material is received in the formation mold and heated to form the integral encapsulating support structure 50 after the molding material is solidified. The integral encapsulating support structure 50 will wrap up the circuit board 40 and the outside area of the filter element 80, so as to integrally combine the integral encapsulating support structure 50, the filter element 80, the photosensitive sensor 20, and the circuit board 40 together.

It is appreciated that since the insulating member 30 insulates the inner area of the filter element 80 from the outer area thereof, the molding material added in the formation mold is prevented to flow to the inner area of the filter element 80, that avoids burrs forming at the side facing the inner area of the filter element 80 of the integral encapsulating support structure 50, so as to ensure the imaging quality of the camera module and increase the product yield rate of the camera module.

And then, the optical lens 10 is supported in the photosensitive path of the photosensitive sensor 20 to produce the camera module. When the camera module is used, light reflected from an object enters the camera module through the optical lens 10, and then the light is filtered by the filter element 80 and received by the photosensitive sensor 20 to conduct a photoelectric conversion and generate image of the corresponding object.

Figure 12:
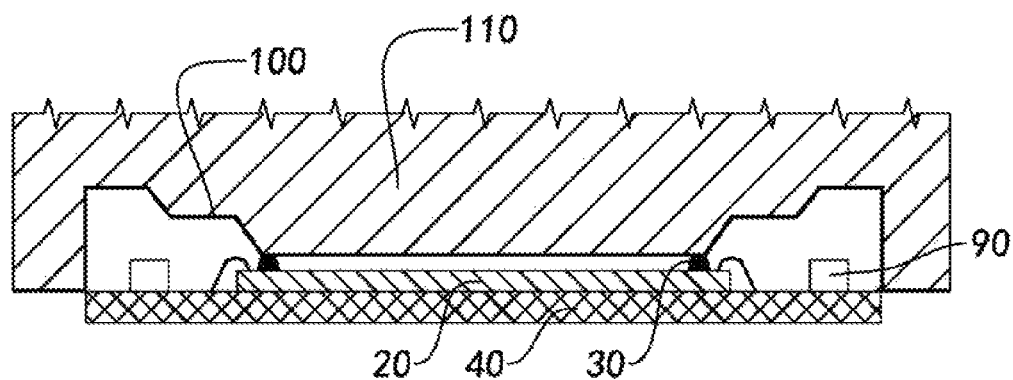
FIG. 12 is a schematic view illustrating the first step of another manufacturing process of the camera module according to the above preferred embodiment of the present invention.
Figure 13:
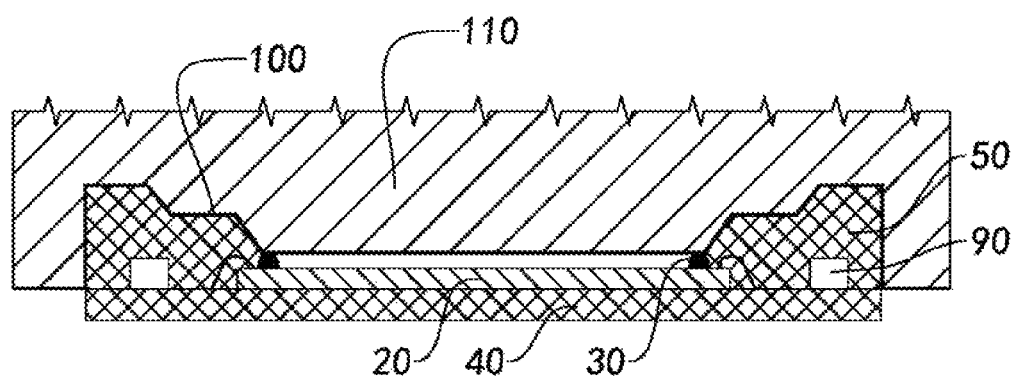
FIG. 13 is a schematic view illustrating the second step of another manufacturing process of the camera module according to the above preferred embodiment of the present invention.

Referring to FIGS. 12 to 13, another manufacture process of the present invention is illustrated. FIG. 12 illustrates the conductive connection of the circuit board 40 and the photosensitive sensor 20 of the camera module, wherein the insulating member 30 is provided on the photosensitive sensor 20 to divide the photosensitive area and the non-photosensitive area of the photosensitive sensor 20. When the circuit board 40, the photosensitive sensor 20, and the insulating member 30 are placed in the formation mold, a covering film 100 provided on the bottom surface of the upper mold of the formation mold to protect the upper mold from directly contacting with the photosensitive sensor 20 or interacts with the insulating member 30, such that the covering film 100 and the insulating member 30 are in contact to protect the upper mold of the formation mold from directly pressing on the photosensitive sensor 20.

It is worth mentioning that, nevertheless FIG. 12 illustrates the photosensitive sensor 20 of the present invention with the insulating member 30 provided thereon as an example to show the covering film 100 interacting with the insulating member 30, the covering film 100 is able to be provided on a mold pressing surface of the upper mold of the formation mold 110. Therefore, the difficulty of demolding has been reduced and, due to the cushion effect and the connection between the insulating member 30 and the covering film 100, the tightness thereof is also enhanced.

FIG. 13 illustrates a step of forming the integral encapsulating support structure 50 in the manufacturing process of the camera module, wherein the formation mold, with the molding material placed therein, is adapted to form the integral encapsulating support structure 50 after the molding material is solidified, wherein the integral encapsulating support structure 50 encapsulates at least the top surface of the circuit board 40, at least portion of the non-photosensitive area of the photosensitive sensor 20, and the outer peripheral surface of the insulating member 30, so as to combine the integral encapsulating support structure 50, the photosensitive sensor 20, and the circuit board 40 to form an integral structure.

And then, the optical lens 10 is supported along the photosensitive path of the photosensitive sensor 20 to produce the camera module. When the camera module is in used, light reflected from an object enters the camera module through the optical lens 10, and then the light is filtered by the filter element 80 and received by the photosensitive sensor 20 to conduct photoelectric conversion and generate image of the respective object.

Figure 14:
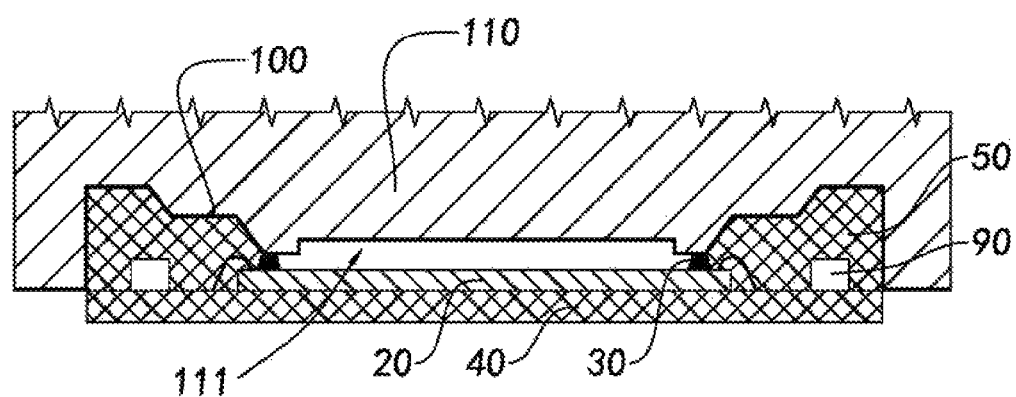
FIG. 14 is a sectional view of another preferred embodiment of the manufacturing process of the camera module according to the above preferred embodiment of the present invention.

As shown in FIG. 14, the formation mold 110 forms an inner recess 111, corresponding to the photosensitive area of the photosensitive sensor 20, in the bottom surface of the formation mold 110, so as to provide a safety gap between the photosensitive sensor 20 and the bottom surface of the formation mold 110, that further reduces the adverse effect to the photosensitive area of the photosensitive sensor 20 and prevents it from being damaged and scratched. It is appreciated that such inner recess 111 may also utilize in the embodiments as illustrated in FIGS. 12 and 13. In other words, the bottom surface of the formation mold in the present embodiment can also further provided with the covering film 100.

Those skilled in the art shall understand that the above mentioned embodiments of the present invention in the descriptions and figures are to give examples, but to confine the present invention. Objectives of the present invention are completely and effectively implemented. Notions of the functions and structures of the present invention have been shown and described in the embodiments, whereas implementations of the present invention may have modifications or changes in any ways without going against the above notions.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:
1. A camera module, comprising:
   at least a circuit board;
   at least an optical lens;
   at least an insulating member which is a solidified adhesive having a stickiness after solidification;
   at least a photosensitive sensor, wherein said insulating member is provided on said photosensitive sensor insulating a photosensitive area from a non-photosensitive area of said photosensitive sensor; and
   at least an integral encapsulating support structure, integrally covering and enclosing at least a portion of said non-photosensitive area of said photosensitive sensor and at least an upper surface of said circuit board, wherein said integral encapsulating support structure, said photosensitive sensor, and said circuit board form an integral structure and said optical lens is supported along a photosensitive path of said photosensitive sensor, while said photosensitive sensor is electrically connected with said circuit board.

2. The camera module, as recited in claim 1, further comprising a camera lens supporter, wherein said camera lens supporter is coupled on said integral encapsulating support structure and said optical lens is supported on said camera lens supporter.

3. The camera module, as recited in claim 2, wherein said integral encapsulating support structure integrally extends to form said camera lens supporter.

4. The camera module, as recited in claim 1, further comprising a driver, wherein said driver is supported on said integral encapsulating support structure and electrically connected with said circuit board, wherein said optical lens is mounted on said driver.

5. The camera module, as recited in claim 4, further comprising at least a filter element which is disposed on top of said integral encapsulating support structure.

6. The camera module, as recited in claim 4, wherein said circuit board comprises a set of resistance-capacitance components which is electrically connected on said circuit board and being covered, enclosed and wrapped up by said integral encapsulating support structure.

7. The camera module, as recited in claim 1, further comprising at least a filter element which is disposed on top of said integral encapsulating support structure.

8. The camera module, as recited in claim 1, wherein said circuit board comprises a set of resistance-capacitance components which is electrically connected on said circuit board and being covered, enclosed and wrapped up by said integral encapsulating support structure.

9. The camera module, as recited in claim 1, wherein said insulating member is protruded from said photosensitive sensor.

10. The camera module, as recited in claim 1, wherein said insulating member has an elasticity and flexibility.

11. The camera module, as recited in claim 10, wherein said integral encapsulating support structure covers an outer peripheral surface of said insulating member.

12. The camera module, as recited in claim 1, wherein said integral encapsulating support structure covers an outer peripheral surface of said insulating member.

13. A camera module, comprising:
at least a circuit board;
at least an optical lens;
at least an insulating member which is formed by a solidified material having a stickiness after solidification;
at least a photosensitive sensor;
at least a filter element, which is overlappingly provided on top of said photosensitive sensor, while said insulating member is provided on at least an outer periphery of said filter element; and
an integral encapsulating support structure enclosing and covering said circuit board and an outer area of said filter element, wherein after said integral encapsulating support structure is molded to form, said integral encapsulating support structure, said filter element, said photosensitive sensor, and said circuit board form an integral structure, wherein said optical lens is disposed along a photosensitive path of said photosensitive sensor and said photosensitive sensor is electrically connected with said circuit board.

14. The camera module, as recited in claim 13, further comprising a camera lens supporter, wherein said camera lens supporter is provided on said integral encapsulating support structure and said optical lens is supported on said camera lens supporter.

15. The camera module, as recited in claim 13, further comprising a driver, wherein said driver is supported on said integral encapsulating support structure and is electrically connected to said circuit board, wherein said optical lens is mounted on said driver.

16. A manufacturing method of a camera module, comprising the steps of:
(a) electrically connecting at least a photosensitive sensor with at least a circuit board;
(b) placing said circuit board and said photosensitive sensor in a formation mold;
(c) providing an insulating member formed by a solidified material having a stickiness after solidification between said photosensitive sensor and a bottom surface of an upper mold of said formation mold and positioning said insulating member at the periphery around at least a photosensitive area of said photosensitive sensor;
(d) forming an integral encapsulating support structure by a molding material received in the formation mold to enclose and cover at least a portion of a nonphotosensitive area of said photosensitive sensor and said circuit board and integrally combines with said photosensitive sensor and said circuit board to form an integral structure after said molding material is solidified; and
(e) supporting at least an optical lens along a photosensitive path of said photosensitive sensor to produce said camera module.

17. The manufacturing method, as recited in claims 16, wherein said upper mold of said formation mold has an inner groove provided with respect to said photosensitive area of said photosensitive sensor to prevent said upper mold from directly contacting with said photosensitive area.

18. The manufacturing method, as recited in claims 17, wherein a covering film is provided on said bottom surface of said upper mold of said formation mold.

19. The manufacturing method, as recited in claims 16, wherein a covering film is provided on said bottom surface of said upper mold of said formation mold.

20. The manufacturing method, as recited in claim 16, wherein in the step (d), said molding material encloses and covers said circuit board, said non-photosensitive area of said photosensitive sensor outside said insulating member, and the peripheral surface of said insulating member.

21. The manufacturing method, as recited in claim 16, wherein before the step (e), further comprising a step of:
providing at least a filter element on top of said integral encapsulating support structure and positioning said filter element between said photosensitive sensor and said optical lens.

22. The manufacturing method, as recited in claim 21, wherein the step (c) comprises a step of applying along the periphery around at least said photosensitive sensor to form said insulating member on said periphery of said photosensitive sensor after said insulating member is solidified to insulate said photosensitive area from said non-photosensitive area of said photosensitive sensor during molding, that prevents said upper mold from directly contacting with said photosensitive area and prevents said molding material from flowing to said photosensitive area of said photosensitive sensor, wherein the adhesive is solidified with damp, heat, UV lighting, or other solidifying reaction.

23. The manufacturing method, as recited in claim 16, wherein the step (a) further comprises a step of overlappingly providing a filter element on top of said photosensitive sensor, wherein said filter element has an inner area corresponding to said photosensitive area of said photosensitive sensor and an outer area corresponding to said nonphotosensitive area of said photosensitive sensor, wherein in the step (c), said insulating member is provided on said outer area of said filter element, wherein in the step (d), said integral encapsulating support structure encloses and covers an outer surface of said insulating member, said filter element outside said insulating member, and said circuit board to form said integral structure after said molding material is solidified.

* * * * *